(12) United States Patent
Kim

(10) Patent No.: US 8,053,988 B2
(45) Date of Patent: Nov. 8, 2011

(54) PLASMA DISPLAY DEVICE

(75) Inventor: Ul-Je Kim, Suwon-si (KR)

(73) Assignee: Samsung SDI Co., Ltd., Yongin-Si, Gyeonggi-Do (KR)

( * ) Notice: Subject to any disclaimer, the term of this patent is extended or adjusted under 35 U.S.C. 154(b) by 544 days.

(21) Appl. No.: 12/081,441

(22) Filed: Apr. 16, 2008

(65) Prior Publication Data

US 2008/0266772 A1 Oct. 30, 2008

(30) Foreign Application Priority Data

Apr. 24, 2007 (KR) .................. 10-2007-0039859

(51) Int. Cl.
*H01J 17/49* (2006.01)
(52) U.S. Cl. .............. 313/585; 313/586; 361/679.02; 361/679.21
(58) Field of Classification Search .............. 361/681, 361/679, 679.02, 679.21; 313/585, 586
See application file for complete search history.

(56) References Cited

U.S. PATENT DOCUMENTS

| 6,560,124 | B1* | 5/2003 | Irie et al. | 361/816 |
| 6,847,415 | B1* | 1/2005 | Yoshimura et al. | 349/58 |
| 7,492,433 | B2* | 2/2009 | Imajo et al. | 349/149 |
| 7,492,578 | B2 | 2/2009 | Kim | |
| 2004/0183984 | A1* | 9/2004 | Imajo et al. | 349/151 |
| 2007/0134984 | A1* | 6/2007 | Baik et al. | 439/607 |

FOREIGN PATENT DOCUMENTS

| KR | 10-2003-0034764 A | 5/2003 |
| KR | 10-2005-0018389 A | 2/2005 |
| KR | 10-2006-0121617 A | 11/2006 |
| KR | 10-2006-0126317 A | 12/2006 |

* cited by examiner

*Primary Examiner* — Nimeshkumar Patel
*Assistant Examiner* — Thomas A Hollweg
(74) *Attorney, Agent, or Firm* — Lee & Morse, P.C.

(57) ABSTRACT

A plasma display device including a plasma display panel (PDP) having electrodes between two substrates, a chassis base attached to and configured to support the PDP, printed circuit boards (PCBs) configured to drive the electrodes, and a plurality of flexible printed circuits (FPCs) connected to the plurality of PCBs and the electrodes, wherein at least one PCB configured to drive the electrodes is attached to the PDP.

14 Claims, 4 Drawing Sheets

PLASMA DISPLAY DEVICE

BACKGROUND OF THE INVENTION

1. Field of the Invention

Example embodiments relate to a plasma display device and, more particularly, to a plasma display device having a reduced length flexible printed circuit (FPC).

2. Description of the Related Art

A plasma display device may include a plasma display panel (PDP) for displaying images, a chassis base for supporting the PDP, and printed circuit boards (PCBs) mounted on the chassis base. The PCBs may be electrically connected to the PDP via a FPC. The PDP may further include two glass substrates forming a discharge space therebetween.

One end of the FPC may be connected to a PCB, and the other end may be connected to the PDP to provide an electrical connection thereto. The plasma display device, however, may have the PDP, the chassis base, and the PCB sequentially arranged in a front to rear manner, with the FPC connecting the PDP to the PCB mounted on the chassis base. Thus, the chassis base is between the PDP and the PCB, causing the length of the FPC to be increased.

SUMMARY OF THE INVENTION

Example embodiments are therefore directed to a plasma display device, which substantially overcomes one or more of the problems due to the limitations and disadvantages of the related art.

It is therefore a feature of example embodiments to provide a plasma display device having a reduced length FPC connecting a PDP and a PCB.

It is therefore another feature of example embodiments to provide a plasma display device having a reduced length FPC connecting an address electrode and an address buffer board.

At least one of the above and other features of example embodiments may provide a plasma display device having a PDP having electrodes between two substrates, a chassis base attached to and configured to support the PDP, PCBs configured to drive the electrodes, and a plurality of FPCs connected to the PCBs and the electrodes, wherein at least one PCB configured to drive the electrodes is attached to the PDP.

The PDP may be formed in a generally rectangular shape having a first long side, a second long side, a first short side, and a second short side. The first long side and the second long side may be opposite to each other, and the first short side and the second short side may be opposite to each other and orthogonal to the first long side and the second long side. The chassis base may include a first area corresponding to the first long side and a majority portion of each of the first short side and the second short side, and may expose a second area corresponding to the second long side and a minority portion of each of the first short side and the second short side, such that a rear surface of the PDP may be exposed at the second long side. The chassis base may include reinforcing members attached in the first area of the chassis base. PCBs configured to drive the electrodes may be mounted on the reinforcing members. The at least one PCB may be attached to the PDP in the second area. A double-sided adhesive tape may be disposed between the at least one PCB and the PDP. A metal plate may be disposed between the at least one PCB and the double-sided adhesive tape. The PCBs may be fastened to the metal plate by fasteners, e.g., screws.

The electrodes may include display electrodes and address electrodes. The PCBs configured to drive the electrodes may include a sustain board, a scanning board, an address buffer board, an image processing/control board, and a power supply board. The sustain board, the scanning board, the image processing/control board, and the power supply board may be attached to a rear surface of the chassis base. The address buffer board may be attached to a rear surface of the PDP. The address buffer board may be attached to the rear surface of the PDP in the second area. The double-sided adhesive tape may be disposed between the address buffer board and the rear surface of the PDP. A metal plate may be connected to the address buffer board to improve ground performance. The metal plate may be interposed between the address buffer board and the double-sided adhesive tape. The address buffer board may be fastened to the metal plate by a fastener. The FPC may be connected to the address buffer board and the address electrodes.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
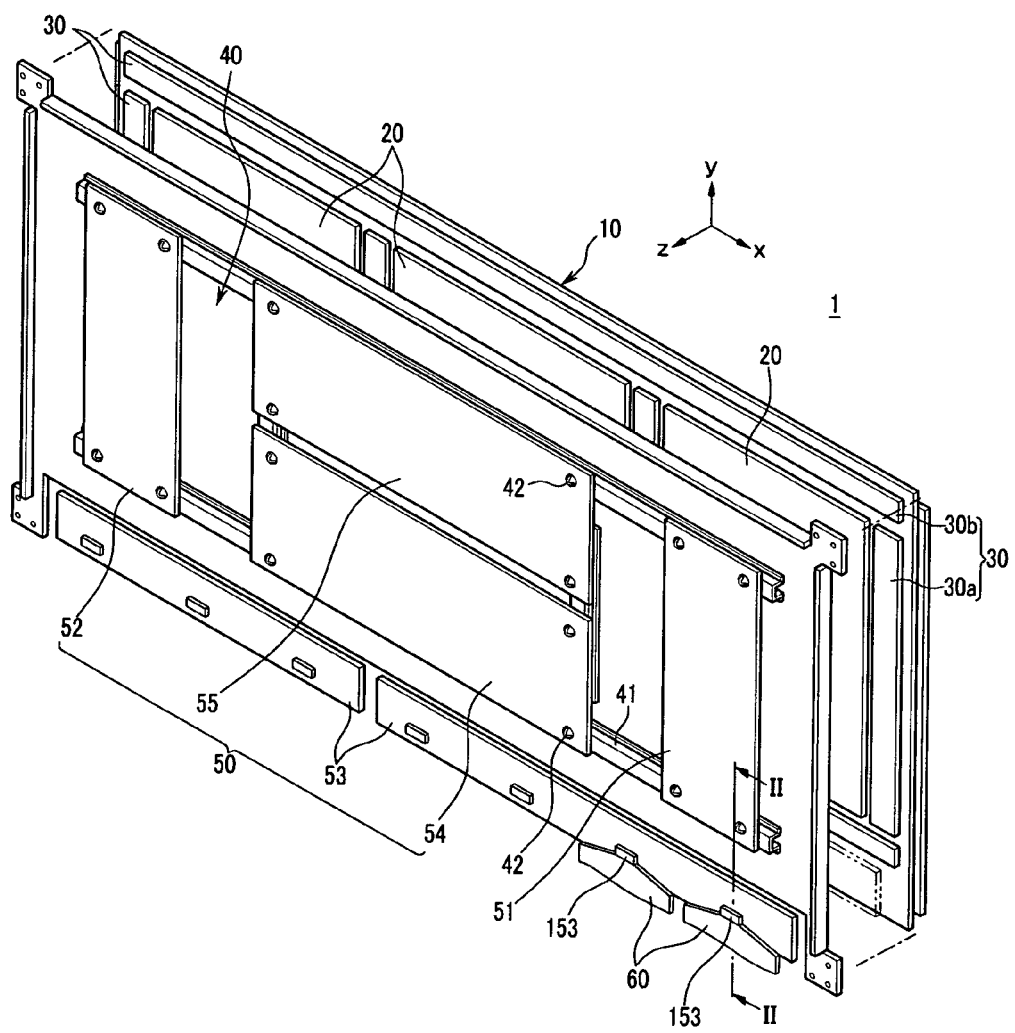
FIG. 1 illustrates an exploded perspective view of a plasma display device according to an example embodiment.

Korean Patent Application No. 10-2007-0039859 filed on Apr. 24, 2007, in the Korean Intellectual Property, and entitled: "Plasma Display Device," is incorporated by reference herein in its entirety.

Example embodiments will now be described more fully hereinafter with reference to the accompanying drawings; however, example embodiments may be embodied in different forms and should not be construed as limited to the embodiments set fourth herein. Rather, these example embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
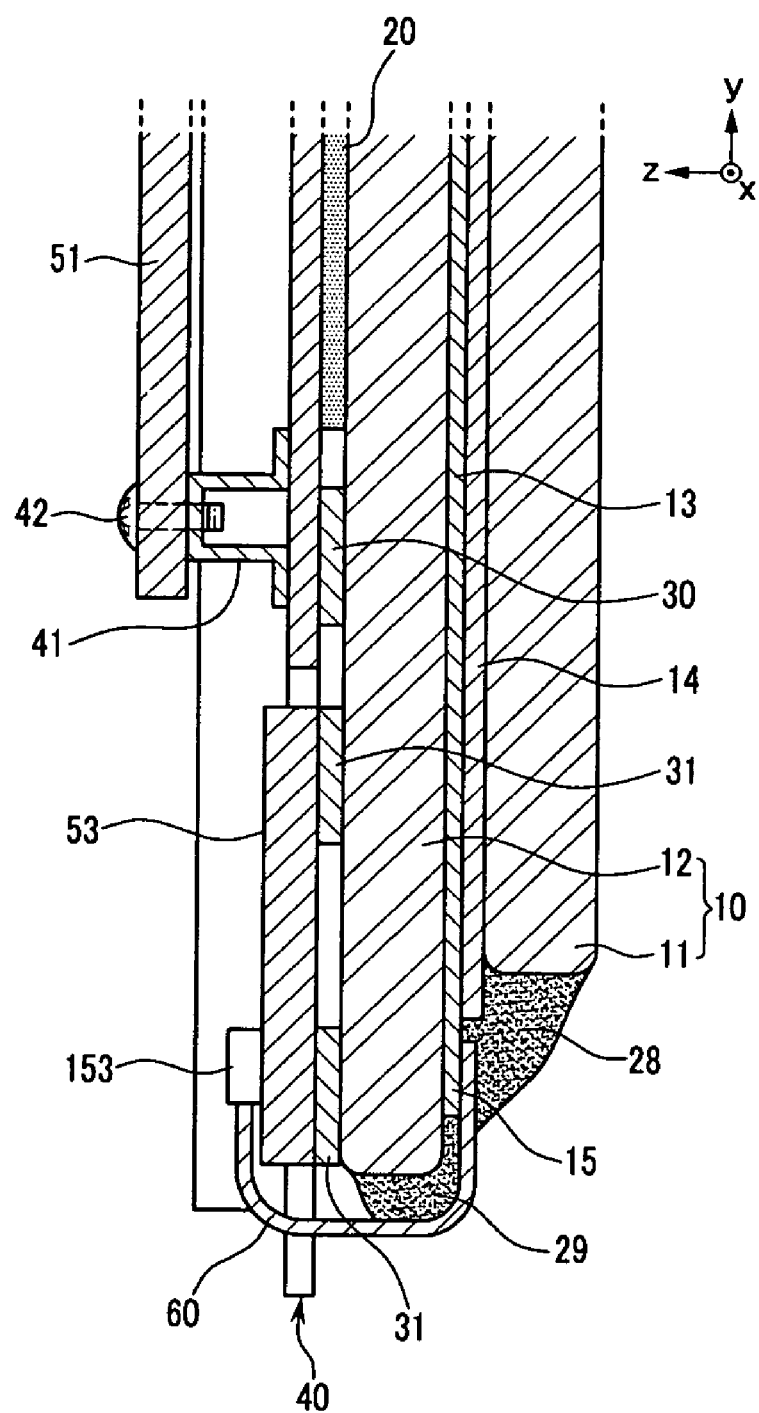
FIG. 2 illustrates a cross-sectional view taken along line II-II of FIG. 1.

Referring to FIGS. 1 and 2, a plasma display device 1 may include a PDP 10 for displaying images, a plurality of heat dissipation sheets 20, a plurality of double-side adhesive tapes 30, a chassis base 40, and a plurality of PCBs 50. The PDP 10 may include a front substrate 11 and a rear substrate 12 attached to be opposite to each other. In addition, the PDP 10 may include electrodes, e.g., display electrodes (not shown), and address electrodes 13, disposed between the substrates 11 and 12.

The address electrodes 13 may be covered with a dielectric layer 14. A portion of the address electric 13 not covered by the dielectric layer 14 may form a terminal 15 extending from the dielectric layer 14. The terminal 15 may be connected to a FPC 60.

The heat dissipation sheets 20 may be provided on a rear surface of the PDP 10. The heat dissipation sheets 20 may conduct and diffuse heat generated in the PDP 10. The heat dissipation sheets 20 may be made of at least one of an acryl heat radiating material, a graphite heat radiating material, a metal heat radiating material, and a carbon nanotube heat radiating material.

The double-sided adhesive tapes 30 may be disposed between the PDP 10 and the chassis base 40. For example, double-sided adhesive tapes 30a may be disposed between the heat dissipation sheets 20 (i.e., in the y-axis direction), and double-sided adhesive tapes 30b may be disposed in an upper side and/or a lower side of the heat dissipation sheets 20 (i.e., in the x-axis direction). The double-sided adhesive tapes 30 may be disposed on the PDP 10 and/or the chassis base 40. In addition, the double-sided adhesive tapes 30 may be partitioned in intervals to reduce the cost of materials.

Figure 3:
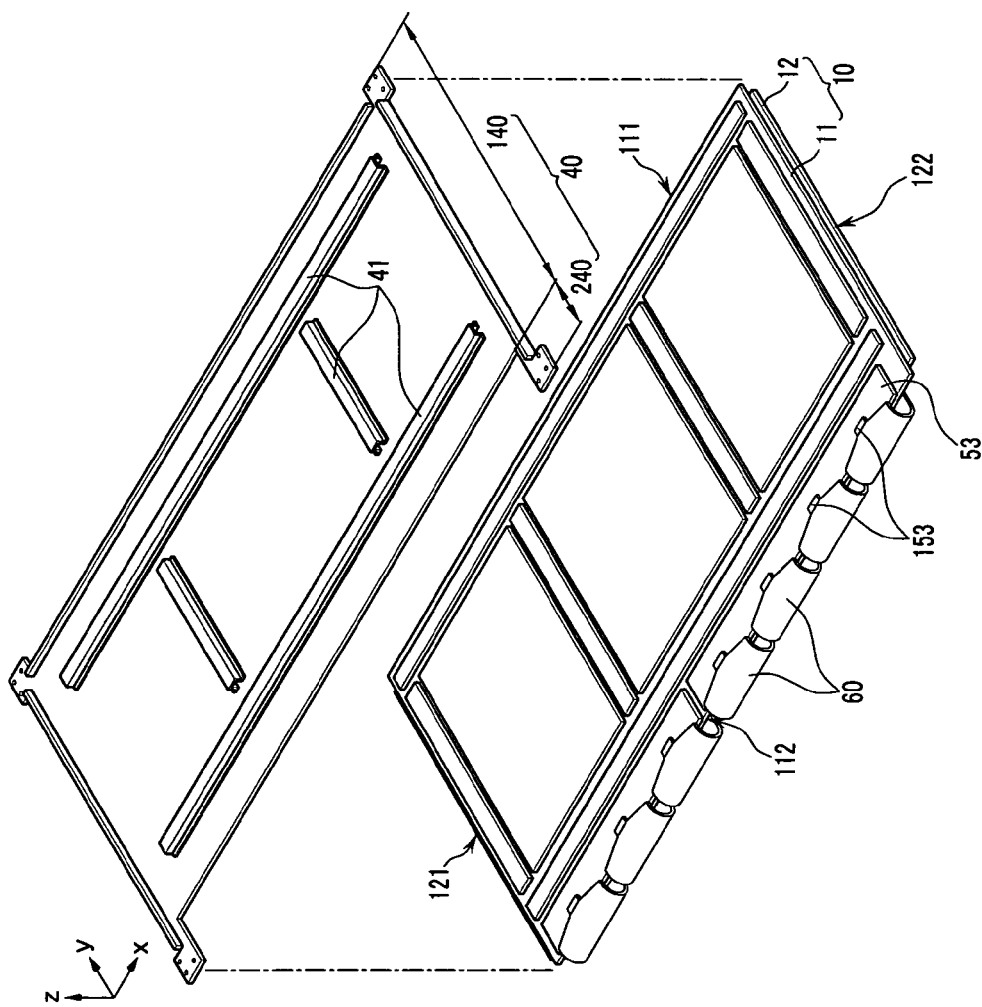
FIG. 3 illustrates an exploded perspective view of a plasma display device having a PDP and a chassis base of FIG. 1.

The chassis base 40 may be attached to the rear surface of the PDP 10 via the double-sided adhesive tapes 30 surrounding the heat dissipation sheets 20. As such, the heat dissipation sheets 20 may be disposed on a front surface of the chassis base 40. On a rear surface of the chassis base 40, a plurality of reinforcing members 41 may be attached thereon, to support and mount some of the PCBs 50. For example, the reinforcing members 41 may be attached to the rear surface of the chassis base 40, and some of the PCBs 50 may be supported and mounted on the reinforcing members 41. In an implementation, two reinforcing members 41 may be disposed in a horizontal direction (i.e., x-axis direction), and two reinforcing members 41 may be disposed in a vertical direction (i.e., y-axis direction), as illustrated in FIG. 3. Some of the PCBs 50 may be mounted on the reinforcing members 41 by fasteners, e.g., screws 42.

In addition, some of the PCBs 50 may also be attached to the rear surface of the PDP 10. In particular, the PCBs 50 may be attached on a lower portion of the PDP 10 exposed by the chassis base 40. In an implementation, one or more PCBs 50 may be directly attached to the PDP 10 by double-sided adhesive tapes 31.

A first sealing material 28 and a second sealing material 29 may be formed at ends of the PDP 10. For example, the first sealing material 28 may be formed at an end of the front substrate 11 and the FPC 60, and the second sealing material 29 may be formed at an end of the rear substrate 12 and the FPC 60. The first sealing material 28 and the second sealing material 29 may prevent ingress of moisture and foreign substances in an area attaching the PCBs 50 and the FPC 60.

The PCBs 50 may provide various operations for driving the PDP 10. For example, the PCBs 50 may include a sustain board 51 for controlling a sustain electrode (not shown) among the display electrodes, a scanning board 52 for controlling a scan electrode (not shown) among the display electrodes, an address buffer board 53 for controlling the address electrodes 13, an image processing/controlling board 54 for applying control signals to corresponding boards, and a power supply board 55 for supplying power required for driving the sustain board 51, the scanning board 52, the address buffer board 53, and the image processing/controlling board 54. The sustain board 51 and the scanning board 52 may be connected to the respective sustain and scanning electrodes via another FPC (not shown). The address buffer board 53 may be connected to one of the address electrodes 13 via the FPC 60.

Referring to FIG. 3, the PDP 10 may be generally rectangular shaped, i.e., having a first long side 111, a second long side 112, a first short side 121, and a second short side 122. The first long side 111 and the second long side 112 may be opposite to each other. The first short side 121 and the second short side 122 may be opposite to each other and orthogonal to the first long side 111 and the second long side 112.

The chassis base 40 may include a first area 140 and may expose a second area 240. The first area 140 of the chassis base 40 may be an area covering a majority portion of the PDP 10, i.e., the first area 140 may include the first long side 111 and a majority portion of each of the first short side 121 and the second short side 122. The second area 240 exposed by the chassis base 40 may be an area of the remaining portion of the PDP 10, i.e., the second area 240 may include the second long side 112 and a minority portion of each of the first short side 121 and the second short side 122.

When the chassis base 40 is attached to the PDP 10, a lower portion of the PDP 10 is exposed, i.e., the second long side 112 in the exposed second area 240. The terminal 15 of the address electrode 13 may be exposed in the second area 240 of the chassis base 40. It should be appreciated that the second area 240 may also be formed in the first long side 111, the first short side 121 and/or the second short side 122 of the PDP 10.

The reinforcing members 41 may be attached in the first area 140 of the chassis base 40 to mount some of the PCBs 50, e.g., the sustain board 51, the scanning board 52, the image processing/controlling board 54, and the power supply board 55 in the first area 140. Another PCB 50, e.g., the address buffer board 53, may be attached to the PDP 10 in the exposed second area 240, i.e., along the second long side 112 of the PDP 10.

Since the FPC 60 may connect the terminal 15 extending from the address electrode 13 of the PDP 10 to a connector 153 of the address buffer board 53, a distance corresponding to a thickness of the chassis base 40 may be reduced in the second area 240, where the address buffer board 53 is attached. That is, since the address buffer board 53 may be attached directly to the rear surface of the PDP 10, the length of the FPC 60 connecting the address electrodes 13 and the connector 153 may be reduced. The FPC 60 may be a tape carrier package (TCP), which may be used to mount a driver IC (not shown) and control the address electrodes 13.

Figure 4:
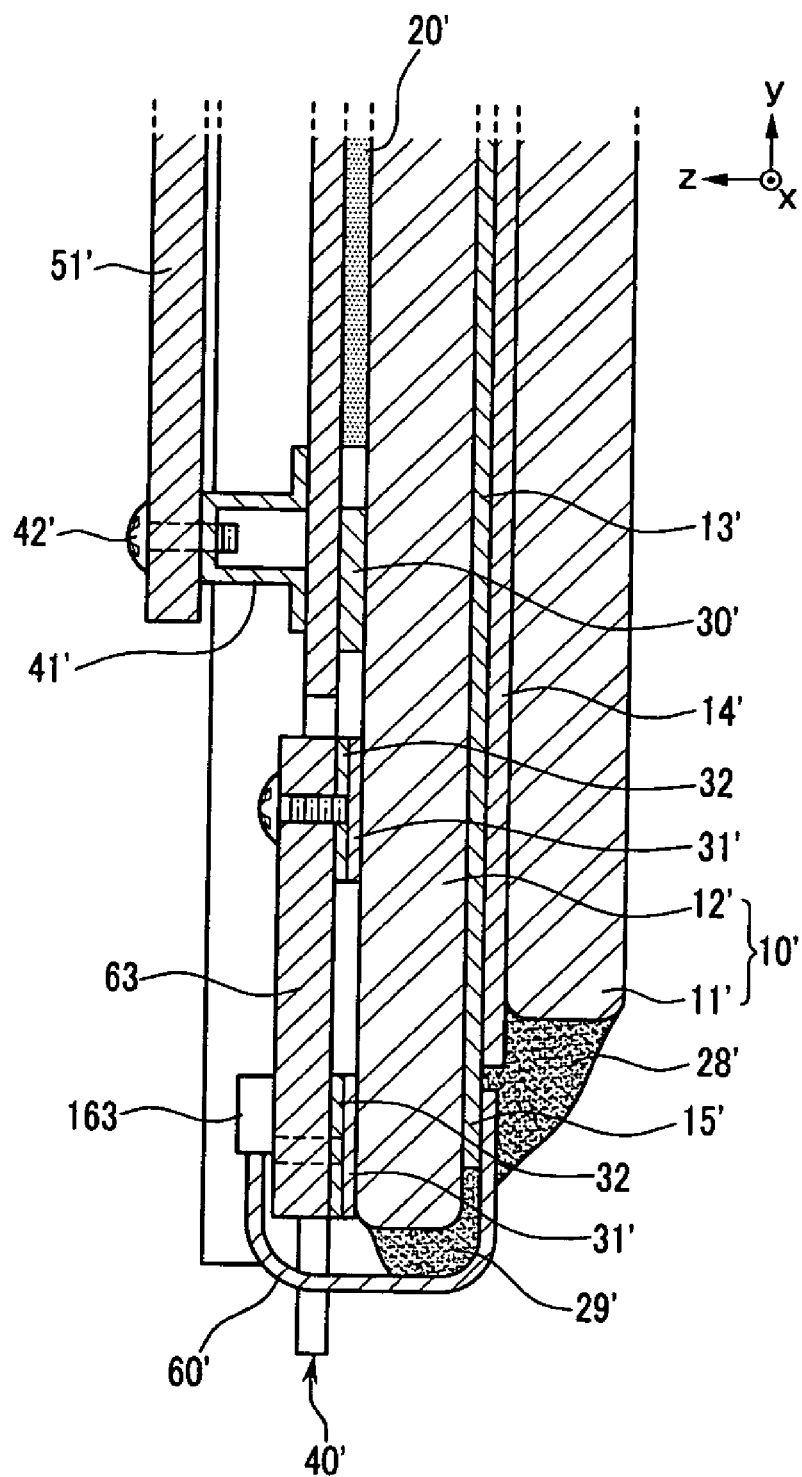
FIG. 4 illustrates a cross-sectional view of the PDP according to another example embodiment.

FIG. 4 illustrates a cross-sectional view of a PDP 10' according to another example embodiment. FIG. 4 is similar to that of FIGS. 1-3, and therefore descriptions of portions similar to those of example embodiments of FIGS. 1-3 will be omitted, and portions different from those of example embodiments of FIGS. 1-3 will be described.

Referring to FIG. 4, a metal plate 32 may be disposed between an address buffer board 63 and the double-sided adhesive tape 31'. The address buffer board 63 may be mounted on the metal plate 32 by a fastener, e.g., a screw 42'. The address buffer board 63 may be attached to the rear substrate 12' of the PDP 10' by way of the metal plate 32 and the double-sided adhesive tape 31'.

A surface of the metal plate 32 may be attached to the double-sided adhesive tape 31', and the other surface thereof may be attached to the address buffer board 63. In addition, the metal plate 32 may be connected to a ground pattern (not shown) of the address buffer board 63 to improve ground performance of the address buffer board 63. Further, in order to improve ground performance, the metal plate 32 may be connected to the chassis base 40'.

Example embodiments may provide a plasma display device for reducing a length of a FPC by directly attaching a PCB to a PDP, and by reducing the length of the FPC, the manufacturing cost may be reduced as well.

Example embodiments may provide a plasma display device for attaching an address buffer board to a rear surface of a PDP, so that a length of a FPC connecting the address buffer board and address electrodes may be reduced.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device, comprising:
a plasma display panel (PDP) having electrodes between two substrates, wherein the PDP is formed in a generally rectangular shape having a first long side, a second long side, a first short side, and a second short side, the first long side and the second long side being opposite to each other, and the first short side and the second short side being opposite to each other and orthogonal to the first long side and the second long side;
a chassis base attached to and configured to support the PDP, wherein the chassis base includes a first area corresponding to the first long side and a majority portion of each of the first short side and the second short side, and the chassis base exposes a second area corresponding to the second long side and a minority portion of each of the first short side and the second short side such that a rear surface of the PDP is exposed at the second long side;
printed circuit boards (PCBs) configured to drive the electrodes;
a plurality of flexible printed circuits (FPCs) connected to the PCBs and the electrodes; and
wherein at least one PCB, configured to drive the electrodes, is attached to the rear surface of the PDP in the second area, and
a double-sided adhesive tape is disposed between at least one PCB and the PDP and a metal plate is disposed between the at least one PCB and the double-sided adhesive tape, the metal plate being in contact with both the at least one PCB and the double-sided adhesive tape, and the metal plate is connected to the at least one PCB so as to improve ground performance.

2. The plasma display device as claimed in claim 1, wherein the chassis base includes reinforcing members attached in the first area of the chassis base.

3. The plasma display device as claimed in claim 2, wherein PCBs configured to drive the electrodes are mounted on the reinforcing members.

4. The plasma display device as claimed in claim 1, wherein the at least one PCB is fastened to the metal plate by fasteners.

5. The plasma display device as claimed in claim 4, wherein the fasteners are screws.

6. The plasma display device as claimed in claim 1, wherein the electrodes include display electrodes and address electrodes.

7. The plasma display device as claimed in claim 6, wherein the PCBs configured to drive the electrodes include a sustain board, a scanning board, an address buffer board, an image processing/control board, and a power supply board.

8. The plasma display device as claimed in claim 7, wherein the sustain board, the scanning board, the image processing/control board, and the power supply board are attached to a rear surface of the chassis base.

9. The plasma display device as claimed in claim 7, wherein the address buffer board is attached to a rear surface of the PDP.

10. The plasma device as claimed in claim 9, wherein the address buffer board is attached to the rear surface of the PDP in the second area.

11. The plasma display device as claimed in claim 10, wherein a double-sided adhesive tape is disposed between the address buffer board and the rear surface of the PDP.

12. The plasma display device as claimed in claim 11, wherein the address buffer board is fastened to the metal plate by a fastener.

13. The plasma display device as claimed in claim 12, wherein the fastener is a screw.

14. The plasma display device as claimed in claim 7, wherein a FPC is connected to the address buffer board and the address electrodes.

* * * * *